United States Patent
Tekin et al.

(10) Patent No.: US 9,143,136 B2
(45) Date of Patent: Sep. 22, 2015

(54) PUMPED DISTRIBUTED WAVE OSCILLATOR SYSTEM

(75) Inventors: Ahmet Tekin, Mission Viejo, CA (US); Ahmed Emira, Mission Viejo, CA (US)

(73) Assignee: WAVEWORKS, INC., Irvine, CA (US)

( * ) Notice: Subject to any disclaimer, the term of this patent is extended or adjusted under 35 U.S.C. 154(b) by 951 days.

(21) Appl. No.: 13/374,165

(22) Filed: Dec. 14, 2011

(65) Prior Publication Data
US 2013/0157584 A1 Jun. 20, 2013

(51) Int. Cl.
| | |
|---|---|
| H03B 27/00 | (2006.01) |
| H03L 5/00 | (2006.01) |
| H03L 7/24 | (2006.01) |
| H03K 3/03 | (2006.01) |
| H01Q 3/26 | (2006.01) |
| H04B 1/38 | (2015.01) |
| H03B 5/12 | (2006.01) |
| H03B 5/18 | (2006.01) |
| H01Q 3/28 | (2006.01) |
| H01Q 3/30 | (2006.01) |
| H01Q 3/42 | (2006.01) |

(52) U.S. Cl.
CPC .. *H03L 5/00* (2013.01); *H01Q 3/26* (2013.01); *H03B 5/1212* (2013.01); *H03B 5/1228* (2013.01); *H03B 5/1852* (2013.01); *H03B 27/00* (2013.01); *H03K 3/0315* (2013.01); *H03L 7/24* (2013.01); *H04B 1/38* (2013.01); *H01Q 3/28* (2013.01); *H01Q 3/30* (2013.01); *H01Q 3/42* (2013.01)

(58) Field of Classification Search
CPC .......... H03K 3/0315; H03L 7/24; H01Q 3/26; H01Q 3/30; H01Q 3/42; H01Q 3/28
USPC ............. 455/260; 375/219, 298, 324; 331/57, 331/45, 46, 96; 342/373, 375, 368
See application file for complete search history.

(56) References Cited

U.S. PATENT DOCUMENTS

| | | |
|---|---|---|
| 2,691,099 A | 10/1954 | Lien |
| 2,735,941 A | 2/1956 | Peck |
| 3,516,021 A | 6/1970 | Kohn |
| 4,568,889 A | 2/1986 | Bayraktaroglu |
| 4,686,407 A | 8/1987 | Ceperley |
| 4,749,963 A | 6/1988 | Makimoto et al. |

(Continued)

FOREIGN PATENT DOCUMENTS

| | | |
|---|---|---|
| CA | 2355930 | 1/2011 |
| DE | 10215414 | 10/2003 |
| JP | 61- 247763 | 11/1985 |

OTHER PUBLICATIONS

Ham et al., "A Circular Standing Wave Oscillator", IEEE International Solid-State Circuits Conference, Digest of Technical Papers, pp. 380-533, Feb. 2004.

(Continued)

*Primary Examiner* — Arnold Kinkead
(74) *Attorney, Agent, or Firm* — Oktay Enterprises Int'l., LLC; Sevgin Oktay

(57) ABSTRACT

A Pumped Distributed Wave Oscillator (PDWO) that provides a high purity accurate signal source with multiple oscillation phases. High-accuracy, high-frequency oscillation phases open paths to high performance phased-array transceiver design. Additional noise-canceling, noise-shaping circuit techniques result in enhanced sensitivity in radio design.

18 Claims, 14 Drawing Sheets

(56) References Cited

U.S. PATENT DOCUMENTS

| | | | |
|---|---|---|---|
| 5,584,067 | A | 12/1996 | Buer et al. |
| 5,640,112 | A | 6/1997 | Goto et al. |
| 6,208,294 | B1 | 3/2001 | Kobayakawa et al. |
| 6,342,820 | B1 | 1/2002 | Leyten et al. |
| 6,396,359 | B1 | 5/2002 | Hajimiri et al. |
| 6,400,756 | B2 | 6/2002 | Schilling |
| 7,161,438 | B2 | 1/2007 | Wood |
| 7,242,272 | B2 | 7/2007 | Ham et al. |
| 7,415,264 | B2 | 8/2008 | Ismail et al. |
| 7,545,324 | B2 | 6/2009 | Kalian et al. |
| 7,741,921 | B2 * | 6/2010 | Ismailov ............ 331/55 |
| 7,848,719 | B2 * | 12/2010 | Krishnaswamy et al. .... 455/147 |
| 8,022,887 | B1 * | 9/2011 | Zarnaghi ............ 343/846 |
| 8,895,913 | B2 * | 11/2014 | Tekin et al. ............ 250/252.1 |
| 2009/0251368 | A1 | 10/2009 | McCune, Jr. et al. |
| 2010/0117744 | A1 * | 5/2010 | Takinami et al. ............ 331/45 |
| 2014/0306772 | A1 * | 10/2014 | Banin et al. ............ 331/45 |

OTHER PUBLICATIONS

B. Kleveland et al., "Monolithic CMOS Distributed Amplifier and Oscillator", IEEE International Solid-State Circuits Conference, Digest of Technical Papers, pp. 70-71, Feb. 19.

J. Wood et al., "Rotary Traveling-Wave Oscillator Arrays: a New Clock Technology", IEEE Journal of Solid State Circuits, vol. 36, No. 11, pp. 1654-1665, Nov. 2001.

H. Wu et al., "Silicon-Based Distributed Voltage Controlled Oscillators", IEEE Journal of Solid State Circuits, vol. 36, No. 3, pp. 493-502, Mar. 2001.

F. O'Mahony et al., "10GHz Clock Distribution Using Coupled Standing-Wave Oscillators", IEEE International Solid-State Circuits Conference, Digest of Technical Papers, pp. 428.

Kaminow and Liu, "Propagation Characteristics of Partially Loaded Two-Conductor Transmission Line for Broadband Light Modulators," Proceedings of the IEEE, vol. 51, Jan. 1963.

Divina, L. et al. The Distributed Oscillator at 4 GHz, IEEE Transactions on Microwave Theory and Techniques, vol. 46, No. 12, pp. 2240-2243, Dec. 1998.

H. Hashemi, et al., "A Fully Integrated 24GHz 8-Path Phased-Array Receiver in Silicon", IEEE International Solid-State Circuits Conference, Digest of Technical Papers, Feb. 2004.

S. C. Blaakmeer et al., "The BLIXER, a wideband Balun-LNA-IQ-Mixer topology", IEEE Journal of Solid State Circuits, vol. 43, No. 12, pp. 2706-2715, Dec. 2008.

A. Tekin, et al., "Noise-Shaping Gain-Filtering Techniques for Integrated Receivers," IEEE J. Solid-State Circuits, vol. 44, No. 10, pp. 2689-2701, Oct. 2009.

* cited by examiner

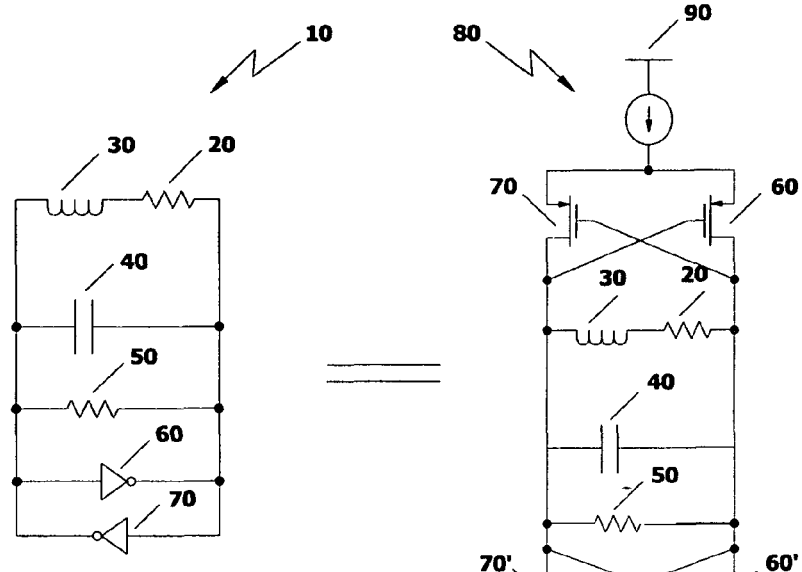
*Prior Art- Fig. 1a*
*Prior Art- Fig. 1b*
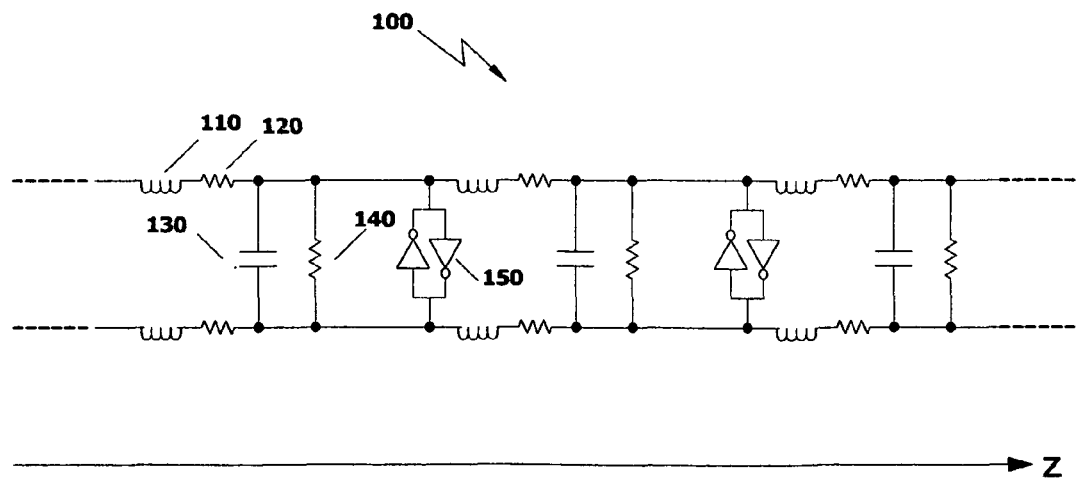
*Prior Art- Fig. 2*

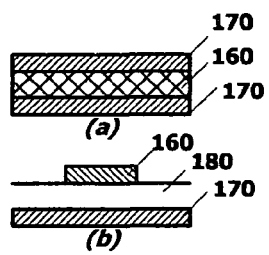
*Prior Art- Fig. 3*
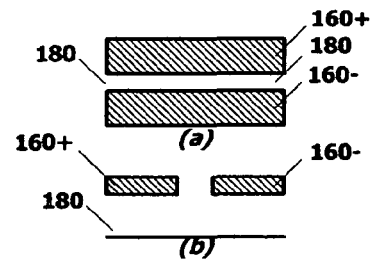
*Prior Art- Fig. 4*
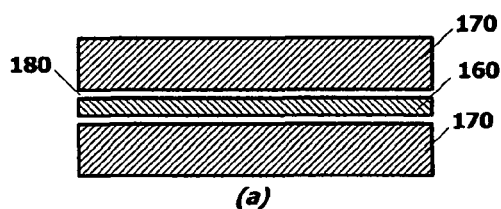
*Prior Art- Fig. 5*
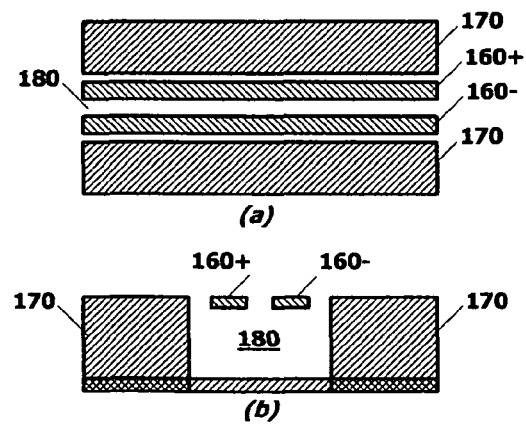
*Prior Art- Fig. 6*

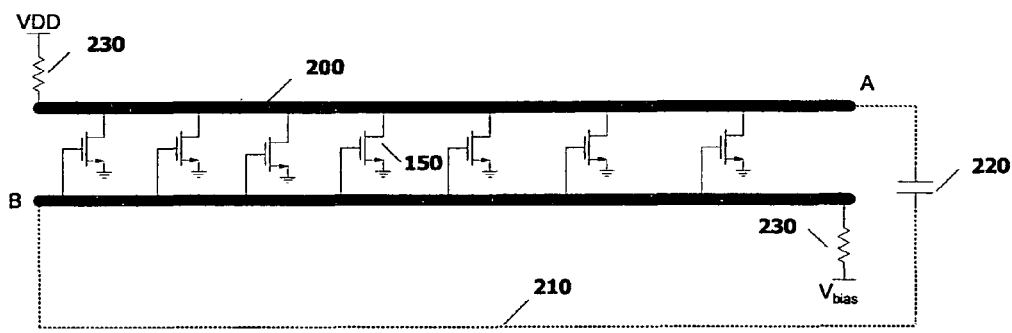
*Prior Art- Fig. 7*
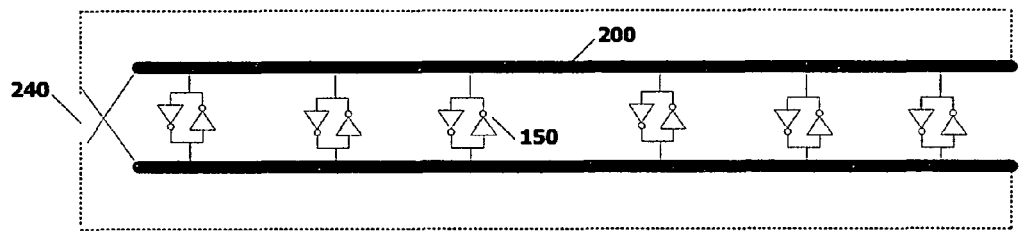
*Prior Art- Fig. 8*
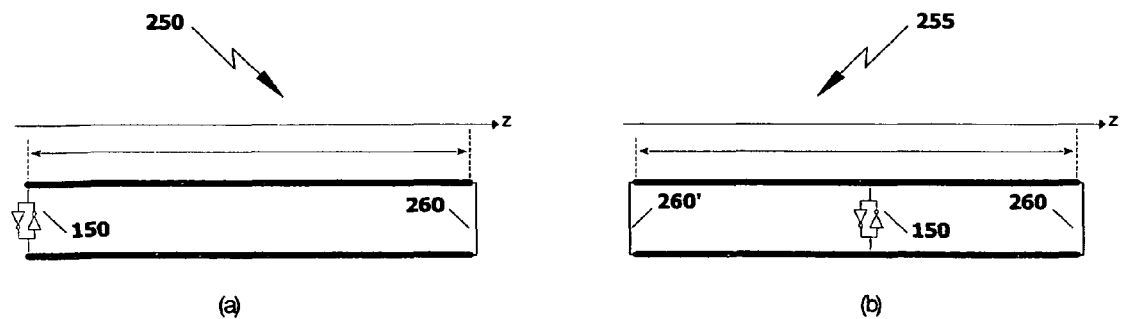
*Prior Art- Fig. 9*

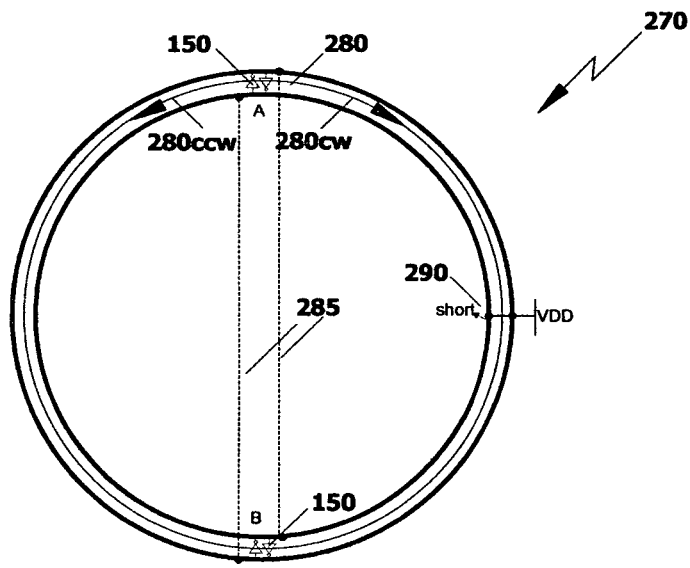
*Prior Art- Fig. 10a*
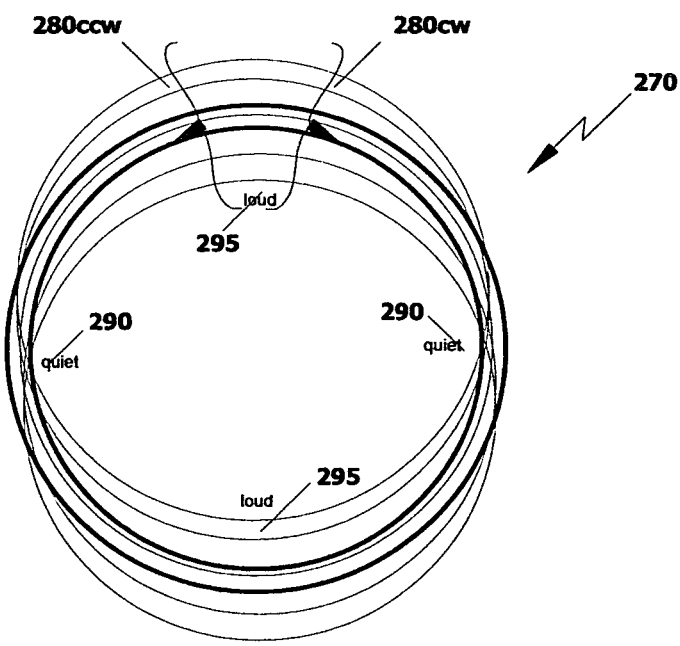
*Prior Art- Fig. 10b*

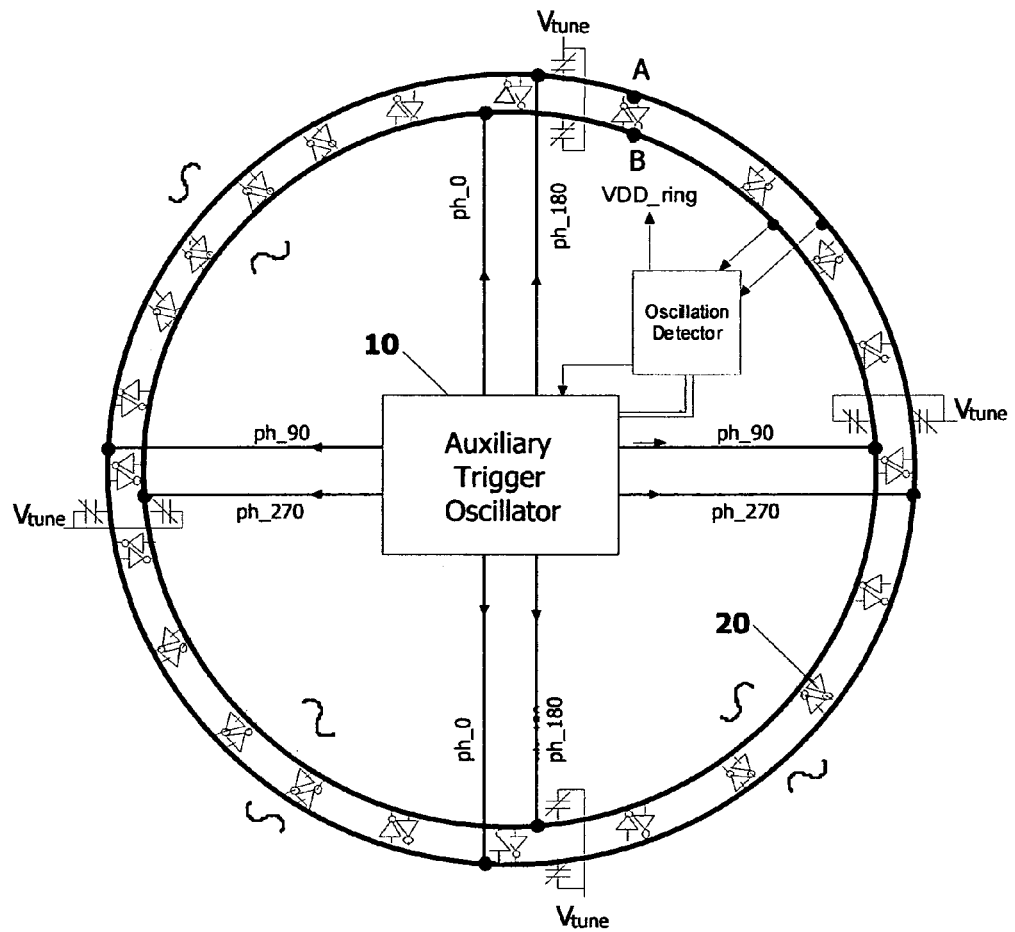
*Prior Art Fig. 11*
[TMDWO]

[FMDWO]

PUMPED DISTRIBUTED WAVE OSCILLATOR SYSTEM

BACKGROUND

All references cited in this specification, and their references, are incorporated by reference herein where appropriate for teachings of additional or alternative details, features, and/or technical background.

Disclosed is a transmission-line based traveling wave oscillator system that provides a high-purity accurate signal source with multiple oscillation phases. Oscillation, in electrical sense, can be defined as repetitive variation of voltage or current in time. An oscillator is a circuit that can provide these repetitive voltage or current waveforms. In the art of electronics, oscillators have always been important circuit blocks that are used to generate time varying signals carrying timing information. Many electronic systems, such as, optical links, wireline/wireless transceivers and other data communication circuits utilize oscillators as a source of well-defined timing signals.

Generally, there are two main types of electronic oscillators that produce repetitive electronic signals: the harmonic oscillator and the relaxation oscillator. The harmonic oscillator produces a sinusoidal output. The basic form of a harmonic oscillator is an electronic amplifier with the output attached to a narrow-band electronic filter, and the output of the filter attached to the input of the amplifier. When the power supply to the amplifier is first switched on, the amplifier's output consists only of noise. The noise travels around the loop, being filtered and re-amplified until it increasingly resembles the desired signal. The relaxation oscillator is often used to produce a non-sinusoidal output, such as a square wave or sawtooth. The oscillator contains a nonlinear component such as a transistor that periodically discharges the energy stored in a capacitor or inductor, causing abrupt changes in the output waveform. Square-wave relaxation oscillators can be used to provide the clock signal for sequential logic circuits such as timers and counters, while the sawtooth oscillators can be used in the time-based circuits that generate the horizontal deflection signals for cathode ray tubes in analogue oscilloscopes and television sets.

Most conventional electronic oscillator circuits use two reactive components, an inductor and a capacitor to create a resonant circuit, in an ideal case indefinitely transferring the energy from one to the other. However, in reality, the loss mechanisms associated with these reactive devices (can be modeled as resistance (R) and/or transconductance (G) elements) require active amplifying circuitry to compensate for these losses. The classical implementation for such an active compensation circuit is negative resistance circuit formed by cross-coupled active devices. A well-known MOSFET (Metal-oxide Semiconductor Field Effect Transistor) implementation of this configuration is shown in FIGS. 1a-1b and FIG. 2. The resultant oscillation frequency is given by the well-known relationship $$f_{osc} = \frac{1}{2\pi\sqrt{LC}},$$

where L is the inductance of inductor 30 and C is the capacitance of capacitor 40 of the so-called L-C tank oscillators 10 and 80 shown in FIGS. 1a-1b. The parasitic resistance R 20 associated with inductor 30 and the parasitic conductance G 50 associated with capacitor 40 results in losses in the tank-oscillators 10 and 80 of FIGS. 1a-1b, respectively that need to be compensated through cross-coupled inverting amplifiers 60 and 70 shown in the same FIGS. 1a-1b. In a CMOS (Complementary Metal-Oxide Semiconductor) technology, an inverting amplifier is implemented by connecting the drains and gates of a PMOS and an NMOS transistor together, resulting in a well-known oscillator circuit 80 shown in FIG. 1b, where 90 provides power supply potential ($V_{DD}$). The devices 70 and 70' of circuit 80 in FIG. 1b correspond to the inverting amplifier 70 of circuit 10 in FIG. 1a, whereas the devices 60 and 60' of circuit 80 in FIG. 1b correspond to the inverting amplifier 60 of circuit 10 in FIG. 1a.

Since the transmission lines are effectively distributed LC structures, distributed LC-oscillators can be constructed using transmission lines of which FIG. 2 is exemplary. A transmission line is, in general, parallel running conductors separated by a dielectric material. Micro-strip line (FIGS. 3a-b), coplanar wave guide (FIGS. 4a-b), coplanar strip line (FIGS. 5a-b), and differential coplanar wave guide (FIGS. 6a-b) are some of the most common transmission line structures. (Similar numerals refer to similar parts shown in FIGS. 3-6. Thus 160, 170, 180 refer to respective signal lines, ground planes and dielectric layers separating the signal layer from the ground plane. Positive and negative signal lines are designated as $160^+$ and $160^-$, respectively. Similarly, character (a) references top-view, while character (b) references cross-sectional views of the respective transmission line structures in FIGS. 3-6). Although any of these structures can be used to construct an oscillator, the differentially symmetric ones are more favorable since the opposite phases of a signal are already available (coplanar strip line and differential coplanar wave guide).

Oscillator 100 in FIG. 2 shows an electrical model for a differential transmission line. In the same figure, 110 is inductance of $L_o dz/2$ where $L_o$ is inductance per unit length, 120 is resistance of $R_o dz$ where $R_o$ is resistance per unit length, 130 is differential capacitance of $C_o dz$ where $C_o$ is capacitance per unit length and 140 is differential conductance of $G_o dz$ where $G_o$ is differential conductance per unit length for a differential transmission line stretching in z direction. The inductance per unit length and capacitance per unit length determine the phase velocity of the propagating wave. The phase velocity of a wave is given $v=1/\sqrt{L_o C_o}$ where $L_o$ and $C_o$ are inductance per unit length and capacitance per unit length, respectively. Then, for a given total length of transmission line, the oscillation frequency can be calculated to be $$f_{osc} = \frac{1}{\sqrt{L_{tot}C_{tot}}},$$

where $L_{tot}$ and $C_{tot}$ are the total inductance and total capacitance along the transmission line. As described before, cross-coupled active amplifiers 150 are used to compensate for the conductor and substrate losses. Thanks to the distributed nature of these transmission line oscillators, multiple phases of an oscillation are available along the transmission line, whereas only two 180 deg opposite phases are available in case of a lumped L-C tank oscillators. Distributed Wave Oscillators, Rotary Traveling or Distributed Wave Oscillators, Standing Wave Oscillators are different classes of existing transmission line based oscillators all utilizing the distributed L-C nature of a transmission line structure.

FIG. 7 shows a simplified distributed oscillator of transmission line type 200 with characteristic impedance of $Z_o$. The actual shape can be in any closing geometric form bringing point A to the vicinity of point B so that dashed AC coupled connection 210 can be obtained using a capacitor $C_{bp}$ 220. The reflections resulting from the mismatch of the biasing resistor, $R_{match}$ 230 to the line impedance, $Z_O$, can be significant source of disturbance in the steady-state oscillation waveforms. This affect together with an additional non-ideality due to the bypass capacitor $C_{bp}$ are the main drawbacks of this oscillator technique.

Another transmission line oscillator approach, Rotary Traveling Wave Oscillator technique shown in FIG. 8, avoids this disadvantage by direct cross-coupling 240 of the end points with an additional cost of odd symmetry introduced by this crossing or crossover of the transmission lines. The single-wire closed-loop structure of a Rotary Traveling Wave Oscillator limits the disturbances to one crossover which can still be significant at especially high-frequencies. Once enough gain is provided, there is no latch-up danger for the technique; since it utilizes a single-line DC-coupled closed-loop structure.

Standing Wave Oscillators (SWO) are another group of transmission line oscillators that would utilize transmission line structures. As is known by those skilled in the art, standing waves are formed by superimposing the forward and the backward distributed waves on the same transmission medium simultaneously. The two basic Standing Wave Oscillator topologies, quarter-wave λ/4 SWO 250 and half-wave λ/2 SWO 255 are shown in FIGS. 9a-b, respectively. A λ/2 SWO is basically combination of two λ/4 SWOs around a center symmetry point, with fundamental operating principle staying the same. In this type of oscillators, the differential transmission line structure is driven by cross-coupled amplifier 150 pair at one end, whereas the other end 260 is shorted. The waves created at the amplifier end 150 are reflected back at the short end 260 causing a reverse propagating wave along the transmission line. In the steady state, the forward and reverse waves coexist, creating standing wave along the line. This would imply amplitude variations in the oscillation phases along the line, gradually diminishing and eventually reaching zero at the short end 260'.

Circular Standing Wave Oscillator (CSWO) 270, shown in FIGS. 10a-10b, is still another standing wave type that would not require any reflection mechanism, but, rather a circular symmetry to create reverse propagating waves along the transmission line medium. As shown in FIG. 10a, the energy is injected into a closed-loop transmission line structure equally and travels symmetrically along the ring in clockwise 280cw and counter-clockwise 280ccw directions. These counter-traveling waves create standing waves with an amplitude profile as shown in FIG. 10b. It will be noted that where the wave components cancel each other a "quiet" node 290 is formed and a "loud" node 295, when the wave components reinforce each other. The energy is injected at two opposite points (A and B) with additional dashed connections 285 to force the main mode. Additionally, at least one of the quiet ports 290 has to be shorted to prevent any latch-up problems. This reduces this structure also to a single-line structure.

It will be known to those skilled in the art that conventional Standing Wave Oscillator structures have a critical drawback of amplitude variations which permits their usage to a limited set of applications. The oscillation phases corresponding to the quiet ports would not even exist, compromising the main advantage of transmission line oscillators. In order to provide, therefore, an electronic oscillator circuitry that can provide invariant multiple phases of an oscillation in an uninterrupted manner, a recent U.S. Pat. No. 7,741,921 by D. Ismailov describes a Trigger-Mode Distributed Wave Oscillator (TM-DWO) System. As shown in FIG. 11, an auxiliary oscillator 10 is required to trigger an oscillation, while in another application Ser. No. 12/930,201 by the present inventors, et al., disclosing a Force-Mode Distributed Wave Oscillator (FM-DWO) system shown in FIG. 12, forcing inverters 420 are used. However, both systems have a tendency to reduce the highest achievable frequencies with concomitant latch-up prevention circuits. What is needed, therefore, is a less complicated system of improved functionality which also can readily lend itself to operational characteristics that avoid latch-up issues.

REFERENCES

U.S. Pat. No. 7,545,324 of Kalian, et al., describes phased array antenna systems and methods providing an approach to phased array antenna communications. An antenna system includes a digital beam former adapted to receive a plurality of input signals and selectively replicate and weight the input signals to provide a plurality of digital subarray signals. Digital to analog (D/A) converters convert the digital subarray signals to a plurality of composite analog subarray signals. Modules of a subarray are adapted to perform analog beam steering on at least one of the composite analog subarray signals. In another example, a subarray of a phased array antenna includes a thermal cold plate, a plurality of feed/filter assemblies, a distribution board stacked on the thermal cold plate, and a plurality of modules adapted to perform analog beam steering. The modules are interconnected with each other through the distribution board and removably inserted into the distribution board.

U.S. Pat. No. 7,415,264 of Ismail, et. al., show a low noise filter arranged to receive an input signal from a downconverter. The low noise filter is constructed to block or cancel any DC offset in the input signal, as well as filter selected frequency components from the input signal. The low noise filter uses a shared capacitor both to handle the DC offset and to set filter response characteristics. As the low noise filter is implemented with a Frequency Dependent Negative Resistance (FDNR) device, the shared capacitor may be relatively small. The low noise filter has a load capacitor, with the output of the load capacitor coupled to a bias resistor and voltage. This bias structure cooperates with the load capacitor to set a high cutoff frequency for the low noise filter useful for blocking or canceling the DC offset U.S. Pat. No. 7,242,272 of Ham, et al., teaches methods and apparatus involving semiconductor devices based on coplanar striplines (CPS). In one example, high-speed microelectronic devices based on coplanar stripline implementations support differential signals in a range of approximately from 1 Gigahertz to at least 60 Gigahertz. In one aspect, CPS-based devices incorporate various features that increase the quality factor Q of the resulting device. In another aspect, an enhancement of the quality factor Q is achieved while at the same time reducing the phase velocity of one or more waves propagating in the device, thereby also facilitating the fabrication of relatively smaller devices. In yet another aspect, a tapered coplanar stripline configuration results in position-dependent line parameters, which may be exploited to achieve significantly high-Q devices. Examples of CPS-based devices incorporating such features include impedance matching devices, devices for power combining and division, delays, resonators, oscillators, filters, amplifiers, mixers and the like, including CMOS-based implementations of such devices.

U.S. Pat. No. 7,161,438 of Wood and U.S. Pat. No. 7,545,225 of Beccue show electronic circuitry for generating and distributing standing wave clock signals. The electronic circuitry includes one or more two-conductor transmission line segments that are interconnected with an odd number of voltage-reversing connections to form a closed loop. A regeneration device is connected between the conductors of the transmission line segments and operates to establish and maintain a standing wave on the loop. At any location on a segment there is a pair of oppositely phase oscillations.

U.S. Pat. No. 6,400,756 of Schilling describes a spread spectrum phased array receiver that has a set of phased array antennas. The set of phased array antennas receive a spread spectrum signal containing a plurality of channels. The receiver outputs timed versions of the received signal. Each timed version is associated with a respective one out of the set of phased array antennas. A plurality of despread signals is produced by despreading each timed version of the received signal using a plurality of chip code sequences associated with the channels. The despread signals are combined as a despread signal. A magnitude of the combined despread signal is determined for obtaining a present and a prior magnitude. The present and prior magnitude is compared. A delay associated with the timed versions is adjusted in response to the comparison so antenna beams are steered towards components of the spread spectrum signal with a highest combined magnitude.

U.S. Pat. No. 6,396,359 of Hajimiri, et al., teaches techniques and structures for tuning integrated, distributed voltage-controlled oscillators (DVCO's) across a wide microwave frequency range are disclosed. One type of DVCO implements a tuning circuit that includes a pair of interconnected amplifying transistors and a current source connected to the transistors, such that a differential voltage input to the circuit adjusts the current to each transistor and effectively adjusts the "electrical length" of one of the transmission lines on which the output frequency is oscillating. This, in turn, adjusts the time delay and thus frequency of the signal propagating on the lines across a wide frequency band.

U.S. Pat. No. 6,342,820 of Leyten, et al., describes a balanced oscillator comprising a frequency selective circuit and a balanced active circuit coupled with the frequency selective circuit. The frequency selective circuit includes a short circuited quarter-wave paired line. The balanced active circuit comprises a cross coupled differential pair of transistors. The balanced oscillator can be tuned in a number of different ways.

U.S. Pat. No. 6,208,294 of Kobayakawa, et al., describes an array antenna receiving device which compensates a phase deviation to perform an efficient beam forming while keeping phase difference information between receivers determined by the arrival direction of a user signal in a communication area to which an antenna element is directive and the array of antenna elements in a radio base station. An analog beam former provides a composite beam so that a phase difference between adjacent beams may have a fixed value determined by beams to be selected. A phase compensator provides digital signals of receivers with phase correction quantities based on any one of the digital signals so that phase differences between the antenna elements may have a fixed value.

U.S. Pat. No. 5,640,112 of Goto, et al., teaches a clock signal distributing system supplying clock signals exhibiting extremely matched phases as a standing wave without employing extra signals such as a reference signal and the like other than clock signal itself. The system compensates for a phase lag in clock signal sand attenuation in signal amplitude. As a result, clock signals exhibiting extremely matched phases are supplied up to the places to be distributed at the respective terminals without requiring equal-length wiring on, for example, a semiconductor chip. The clock signal distributing system is composed of an electromagnetic transmission path line which transmits periodic clock signals as a standing wave, an amplifier, and a phase advancing unit which advances phases of the periodic clock signals wherein a phase lag in transmission of clock signals and a phase lag in amplitude of the amplifier are corrected in the phase advancing direction by the phase advancing unit.

U.S. Pat. No. 5,584,067 of Buer, et al., discloses a dual traveling wave resonator filter including a microstrip line to receive an input signal at a first end and first and second traveling wave resonator rings. Each traveling wave resonator ring is in close proximity to the microstrip line such that first and second resonant first combined signals are induced, respectively, in each of the first and second traveling wave resonator rings in response to the input signal on the microstrip line. A band-reject signal is rejected from the microstrip line and a pass-band signal is produced from the microstrip line at a second end.

U.S. Pat. No. 4,749,963 of Makimoto, et al., shows a high frequency oscillator comprising a ring type inductive resonator of a microstrip line constituted in a rectangular or annular loop. Capacitors are serially connected to both ends of the line, thereby improving the low-noise, separation and stability characteristics by use of the steep-phase characteristic of the ring-shaped resonator.

U.S. Pat. No. 4,686,407 of Ceperley teaches an improved traveling wave ring resonator utilizing only one source of waves. The standard traveling wave ring resonator uses two wave sources phased 90 degrees apart and physically separated by a quarter wavelength to separately excite two equal-frequency standing wave modes which make up a traveling wave. The present invention uses perturbations of the ring resonator to shift the frequency of the standing wave modes, by specified amounts, and to correctly fix their position, to allow a single wave source to properly excite the standing wave modes which comprise a traveling wave. This invention has application to traveling wave ring resonators in acoustics, mechanical devices, and electromagnetic devices, as well as to simply-connected resonators to be excited in rotating wave modes. Specific applications include improved thermo acoustic traveling wave heat engines and pumps, simplified surface wave motors, and energy efficient wave pools for recreational purposes.

U.S. Pat. No. 4,686,407 of Bayraktaroglu describes a distributed diode VCO with stripline coupled output and distributed variable capacitor control. In a distributed IMPATT structure, power is coupled out through a side contact. A sidewall contact extends in a direction which is parallel to the principal direction of propagation of the energy in an active medium. The sidewall contact plus the active region together is considered as a single transmission line. This extended transmission line is also connected to a second distributed semiconductor element which functions as a varactor. By changing the bias voltage on this varactor, the distributed capacitance of a transmission line is changed, and this change in transmission line loading causes a change in the propagation characteristic of the transmission line.

US2009/0251368 of McCune, Jr., et al., describe a phased array receiver including a plurality of receive paths having a plurality of downconverters, a plurality of digitally controlled local oscillators associated with the plurality of receive paths, and a combiner. In response to a plurality of digital phase control signals, the plurality of digitally controlled local oscillators controls phases of a plurality of local oscillator signals generated by the plurality of digitally controlled local oscillators. The phases of the plurality of local oscillator signals are introduced as phase shifts in a plurality of intermediate frequency signals produced by the plurality of downconverters. The plurality of digitally controlled local oscillators is configured to respond to changes in digital values of the plurality of digital phase control signals to achieve a desired phase relationship among the phases of the intermediate frequency signals.

S. C. Blaakmeer et al., "The BLIXER, a Wideband Balun-LNA-IQ-Mixer Topology", *IEEE Journal of Solid State Circuits*; Vol. 43, no. 12, pp. 2706-2715, December 2008, describe how a noise cancellation technique can limit the LNA noise contribution for a given gain level.

A. Tekin, et al., "Noise-Shaping Gain-Filtering Techniques for Integrated Receivers," *IEEE J. Solid-State Circuits*, Vol. 44, no. 10, pp. 2689-2701, October 2009 and A. Pirola, et al., "Current-mode, WCDMA channel filter with in-band noise shaping," *IEEE J. Solid-State Circuits*, Vol. 45, no. 9, pp. 1770-1780, September 2010 describe noise-shaping filtering techniques in radio design.

SUMMARY

Aspects disclosed herein include a Quarter-Pumped Distributed Wave Oscillator (QPDWO) system comprising two or more independent electrical conductors forming transmission line loops of a differential medium for traveling wave oscillations; a plurality of cross-coupled inverting amplifiers distributed along the transmission line loops, the inverting amplifiers further comprising non-complementary metal oxide or bipolar devices; a plurality of quarter wave ($\lambda/4$) shorted transmission line stubs to provide biasing of the cross-coupled inverting amplifiers; the quarter wave ($\lambda/4$) shorted transmission line stubs being distributed symmetrically along said independent electrical conductors: a plurality of varactors to provide tuning for high frequency, high-bandwidth oscillations in the range of at least from about sub-GHz to about THz; and a lumped traveling wave oscillator system where discrete inductors rather than transmission lines are used for the wave oscillation loop path elements.

an Inductively-Pumped Distributed Wave Oscillator (IPDWO) system comprising two or more independent electrical conductors forming transmission line loops of a differential medium for traveling wave oscillations; a plurality of cross-coupled inverting amplifiers distributed along the transmission line loops, the inverting amplifiers further comprising non-complementary metal oxide or bipolar devices; a plurality of inductors to provide biasing of the cross-coupled inverting amplifiers; a plurality of parallel capacitors forming Resonant-Pumped Distributed Wave Oscillator (RPDWO) to create resonance at a core traveling wave frequency at bias injections points; and a plurality of varactors to provide tuning for high frequency, high-bandwidth oscillations at least in the range from about sub-GHz to about THz.

a multi-phase low-noise signal source comprising Trigger-mode Distribute Wave Oscillator (TMDWO), Forced-Mode Distributed Wave Oscillator (FNDWO) or Pumped Distributed Wave Oscillator (PDWO); a front-end phase-shift system coupled with the multi-phase signal source; a back-end phase-shift system coupled with quadrature phases of the multi-phase signal source; a radio front-end topology configured to utilize the multi-phase signal source; a low-noise multi-element phased-array receiver system coupled with the radio front-end; and the multi-element phased-array receiver system further comprising low-noise 4-element phased-array utilizing Blixelter front-end topology with TMDWO, FMDWO, or PDWO wave oscillators as multi-phase signal source providers.

BRIEF DESCRIPTION OF DRAWINGS

FIGS. 1*a* and 1*b* show a conventional Lumped L-C tank oscillator.

FIG. 2 shows a conventional Distributed Oscillator structure using transmission lines.

FIGS. 3-6 show top and cross-sectional views of conventional semiconductor devices comprising a Microstrip line, a Coplanar Wave Guide, a Coplanar Strip Line and a Differential Coplanar Wave Guide, respectively.

FIG. 7 shows a conventional Distributed Oscillator Structure.

FIG. 8 shows a conventional Rotary Traveling Wave Oscillator.

FIGS. 9*a* and 9*b* show a conventional quarter-wave and a half-wave Standing Wave Oscillator, respectively.

FIGS. 10*a* and 10*b* show a conventional quarter-wave and a half-wave Circular Standing Wave Oscillator structure, and amplitude profile along the structure, respectively.

FIG. 11 shows a schematic drawing of a Trigger-Mode Distributed Wave Oscillator (TMDWO) System according to prior art.

DETAILED DESCRIPTION

In embodiments there are illustrated

Pumped Distributed Wave Oscillators (PDWOs) to provide high-bandwidth oscillations in the range of at least from about from sub-Giga Hertz (sub-GHz) to Tetra Hertz (THz) frequencies. The disclosed "pumping" aspect provides a proper supply biasing which in turn prevents undesirable latching-up of oscillating lines as further described below.

Figure 12:
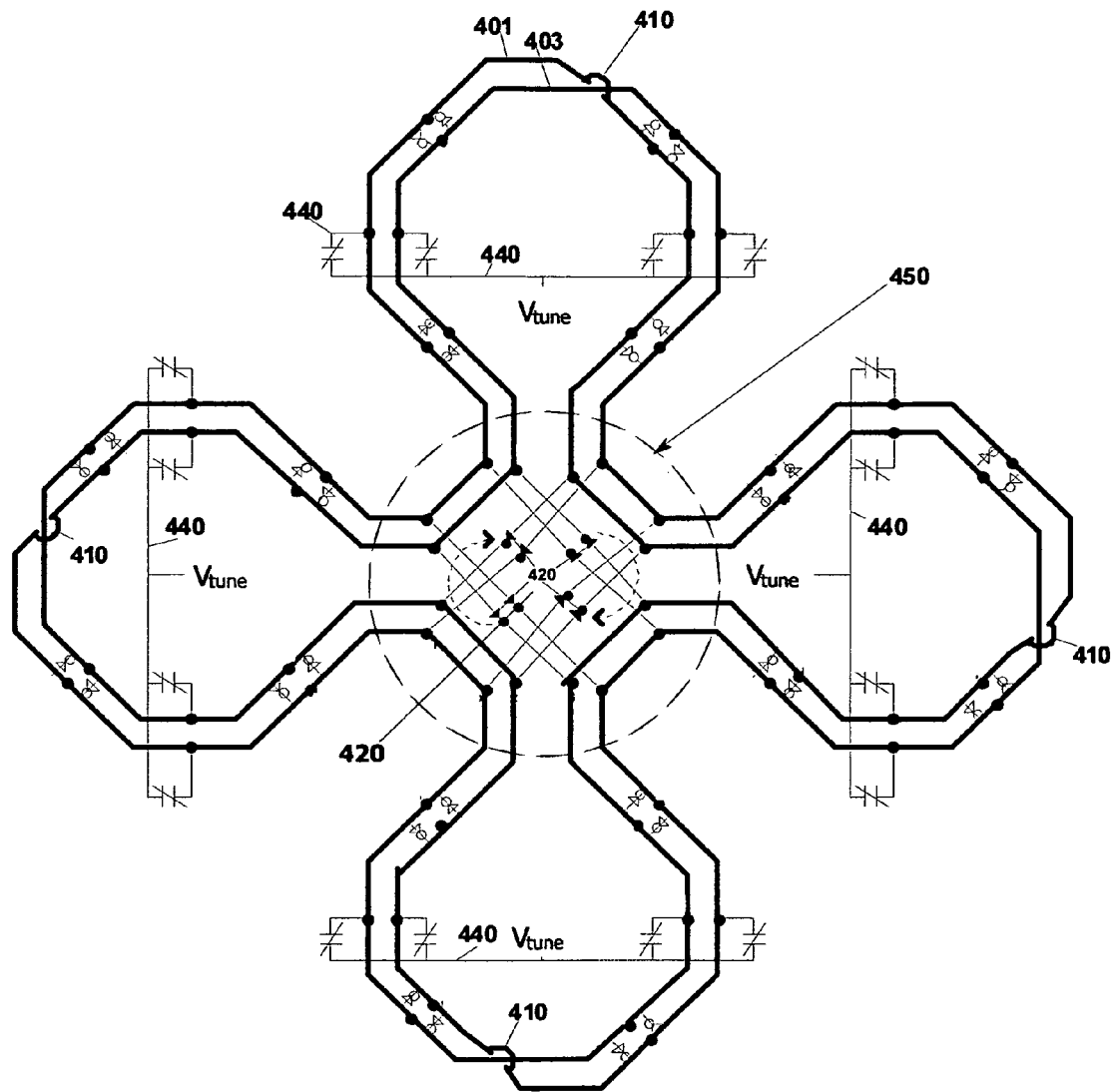
FIG. 12 shows a schematic drawing of a Force-Mode Distributed Wave Oscillator (FMDWO) as described in U.S. Pat. No. 8,791,765.
Figure 13:
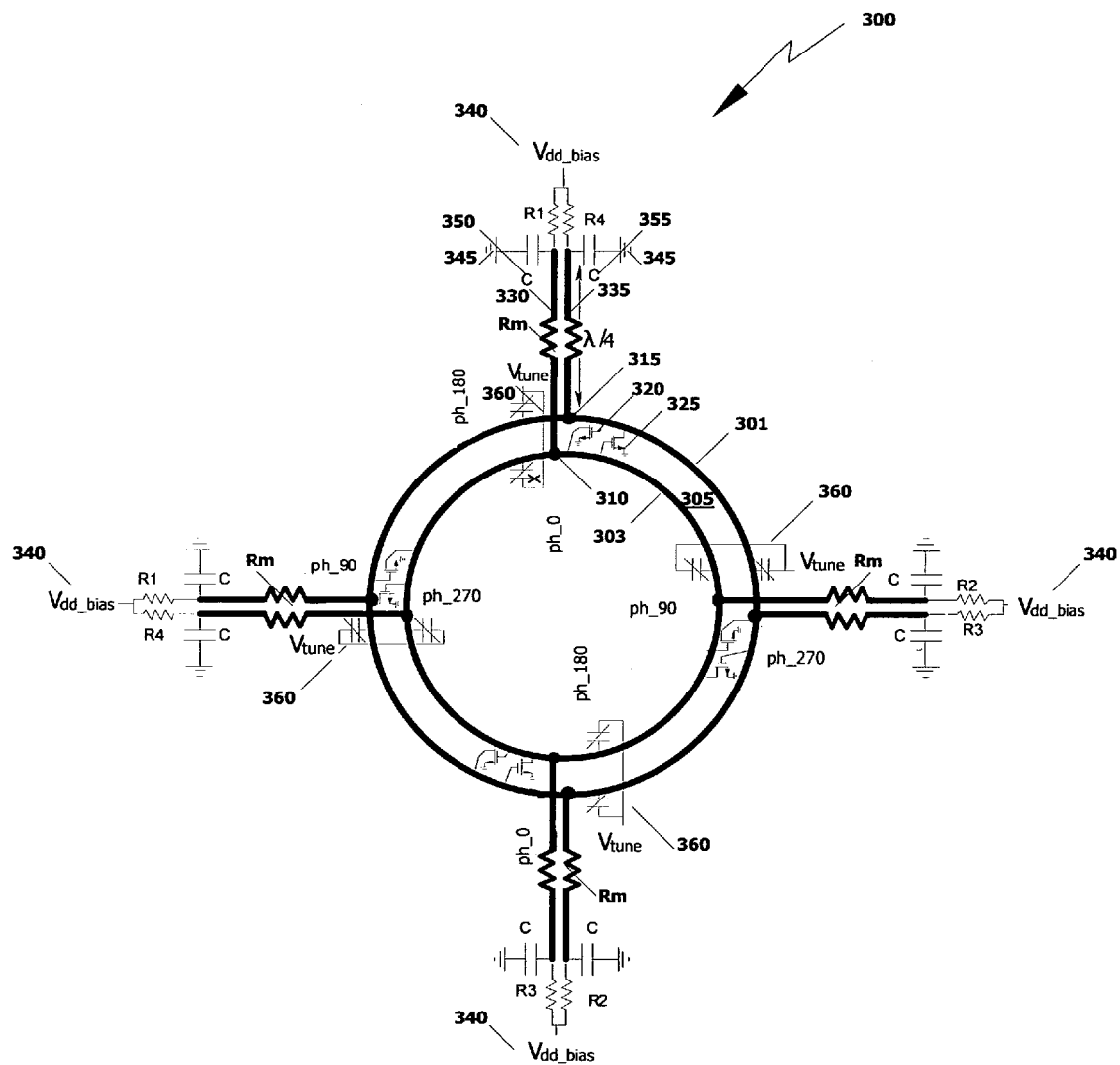
FIG. 13 shows a schematic drawing of the presently disclosed Quarter-Pumped Distributed Wave Oscillator (QPDWO) system.

Referring now to the drawings, FIG. 13 is illustrative of a quarter-pumped distributed wave oscillator Circuit Diagram 300 showing at least two independent transmission lines 301 and 303 formed in the form of a ring, or any symmetric geometrical form, in medium 305. Cross-coupled inverting pair of amplifiers 310 are distributed along the ring of transmission lines 301 and 303 as shown in the same FIG. 13. The quadrature phases shown in FIG. 13 comprise four phases of ph0, ph90, ph180 and ph270 and are routed to their corresponding injection points, such as 310 and 315, along transmission lines 301, 303 in medium 305 with a ring of any symmetrical closed shape, including a triangle, a square, or an octagon, for example. It will be understood that an oscillator with 8, 16 or more number of phases can also be used, routing the available phases to their corresponding locations along the transmission ring medium 305. The supply energy is injected into the closed-loop transmission lines 301 and 303 equally at uniformly distributed points 310 and 315 and the oscillation waves travel symmetrically along the ring 305 in a preferred clockwise or counter-clockwise direction as determined by the power supply injection sequence.

In one aspect of the present disclosure, the two independent transmission line loops 301 and 303 form the differential medium 305 for a traveling wave oscillation using non-complementary NMOS (NPN) or PMOS (PNP) devices 320 and 325 forming cross-coupled inverting amplifiers. The start-up energy is provided by biasing the core oscillator wave tracks 301 and 303 through quarter wave ($\lambda/4$) shorted transmission line stubs 330 and 335, which substantially pose a relatively high impedance at the injection points 310 and 315 and do not load the core oscillator lines 301 and 303. It will be known in the art that the disclosed utilization of non-complementary devices 320 and 325 in the quarter wave length ($\lambda/4$) mode will prevent the latch-up of the oscillation lines 301 and 303. This is because, the noncomplementary inverting amplifiers will always be biased symmetrically around vdd_bias. Due to resulting negative transconductance in the inverting cross-couple amplifiers 320 and 325, a traveling wave oscillation is observed along the two independent transmission lines 301 and 303, each carrying opposite phase of the oscillation. According to the presently disclosed symmetric configuration of the supply biasing $\lambda/4$ short transmission line stubs 330 and 335 and cross-coupled inverting amplifiers 320 and 325, the waves traveling along the two independent loops 301 and 303 provide substantially the same propagation characteristics for the loop conductors 301 and 303 and the loading corresponding to each conductor are identical and symmetric. It will be observed that the richer the distribution of the $\lambda/4$ short transmission line stubs 330 and 335 are, and the more they are symmetrically distributed, the smoother will be the traveling wave. The inverting amplifiers 320 and 325 use the signal in one of the conductor lines 301 and 303 as booster for the opposing phase traveling in the other line. It will also be understood that although the ($\lambda/4$) wave length yields the best performance, wave lengths of multiples thereof, such as shorter ($\lambda/8$) lines may also be used as inductive load to save transmission-line space for a given performance degradation.

The number of $\lambda/4$ supply stubs 330 and 335 can be chosen as a function of the required number of symmetric phase taps. FIG. 13 shows 4-stub supply distribution configuration. According to the present disclosure, the number of supply stubs such as the $\lambda/4$ supply stubs 330 and 335 in FIG. 13 can be chosen with respect to the required number of symmetric phase taps. In an aspect of the present disclosure, the direction of the wave propagation in the core oscillator wave tracks 301 and 303 can be set through an RC delay mechanism 350 and 355 provided by the R values. For example, choosing R1>R2>R3>R4 causes the bias supplies 340, $V_{ddr}$ reach their final values at the corresponding line tracks 301 and 303 with a proportional amount of delay resulting in one preferred start-up wave direction while R4>R3>R2>R1 combination results in a wave propagation in the opposite direction.

In the disclosed oscillatory technique, the whole transmission-line structure constituting the lines 301 and 303 can resonate with the bias injection lines 330 and 335 resulting in lower frequency non-traveling oscillation mode. In order to prevent this low frequency undesired oscillation modes the small value resistors Rm are used in series with the bias injection lines as shown in FIG. 13.

In another aspect of the present disclosure, varactors 360 are distributed along tracks 301 and 303 to tune the oscillation frequency with a control voltage $V_{tune}$ as shown in FIG. 13 in order to circumvent phase-lock in phase-locked loops. It will be understood by those skilled in the art that tracks 301 and 303 may take any shape ranging from circular to square, pentagon, hexagon, octagon, and other closed loops too many to cite here.

Figure 14:
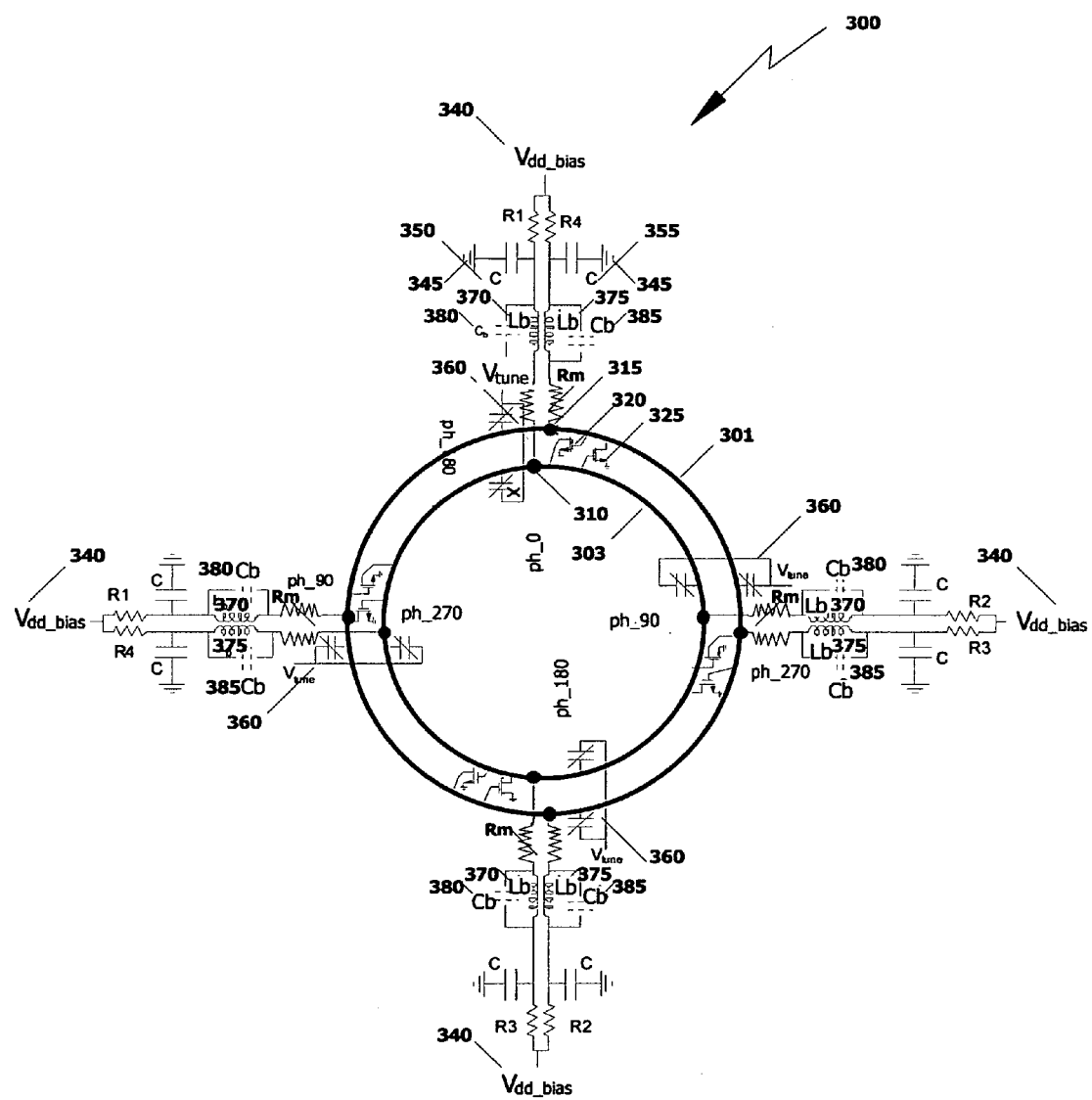
FIG. 14 shows a schematic drawing of the presently disclosed Inductively-Pumped Distributed Wave Oscillator (IPDWO) system and Resonant-Pumped Distributed Wave Oscillator (RPDWO) system.
Figure 15:
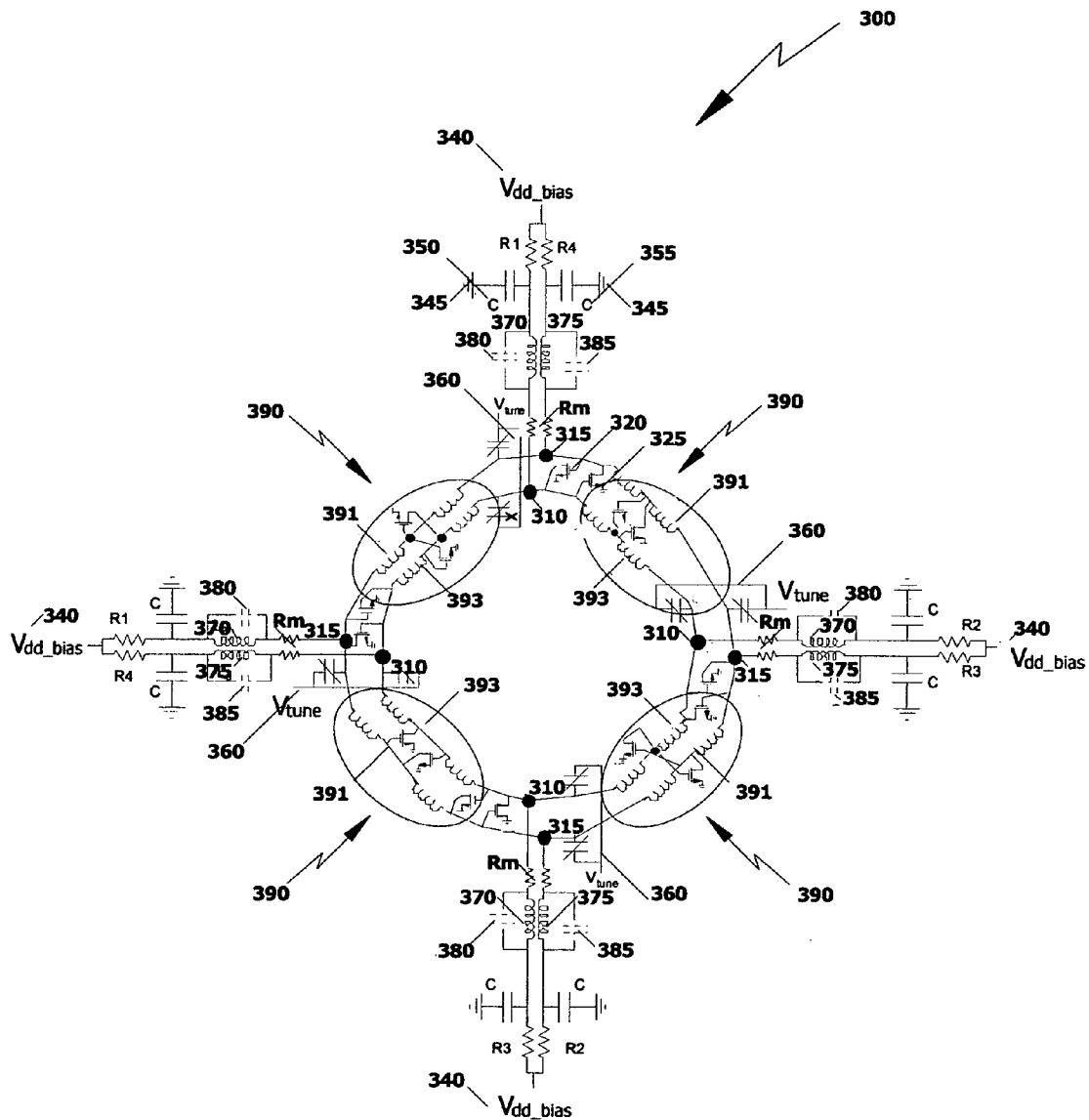
FIG. 15 shows a schematic drawing of the presently disclosed Inductively-Pumped Distributed Wave Oscillator (IPDWO) system and Resonant-Pumped Distributed Wave Oscillator (RPDWO) system with lumped traveling wave loops.

In still another aspect of the present disclosure, FIG. 14 shows an Inductively-Pumped Distributed Wave Oscillator (IPDWO) circuit employing inductors ($L_b$) 370 and 375 in place of $\lambda/4$ quarter-wave transmission-line to bias the core traveling wave oscillator 300. In a further aspect, the inductors 370 and 375 may also be coupled with parallel capacitors ($C_b$) 380 and 385 to create a resonance at the core traveling wave frequency at the particular bias injection junctions such as 310 and 315 resulting in Resonant-Pumped Distributed Wave Oscillator (RPDWO). Again, using small value resistors Rm through this bias injection path reduces the probability of a low frequency non-traveling oscillation mode. In yet another aspect, the core traveling transmission line loops 301 and 303 can be replaced by a lumped 390 conductor lines 391 and 393 shown in FIG. 15. It will again be understood that the number of bias injection points such as 4 pairs 310 and 315 along the core traveling wave loops 391 and 393 as shown in FIG. 15 may be any number suitable for the desired phase resolution and symmetry.

Figure 16:
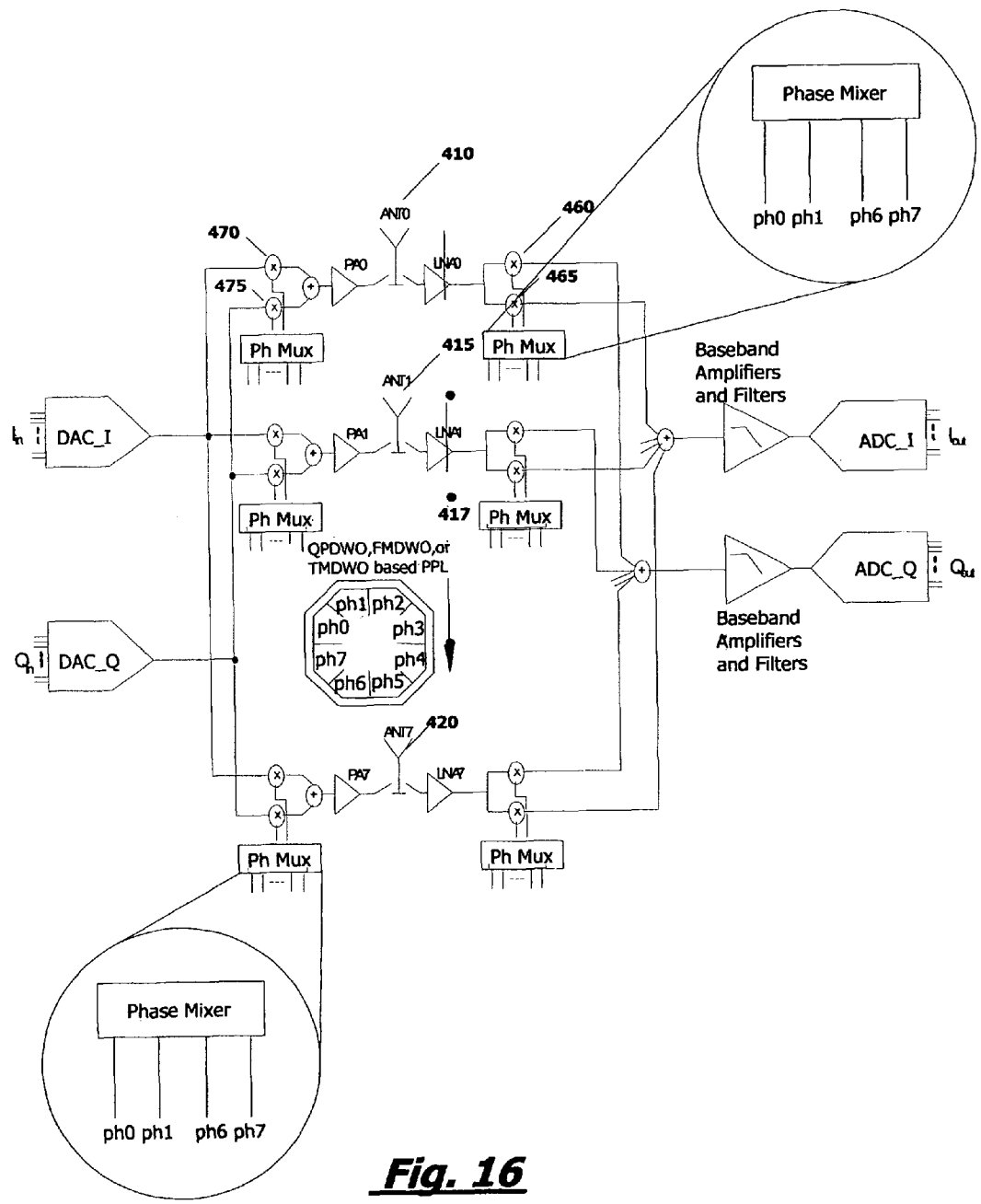
FIG. 16 shows a schematic drawing of the presently disclosed Wave-based Front-end Phased-Array Transceiver System.

FIG. 16 discloses a Wave-based Front-End Phased-Array Transceiver System 400 comprising in this case eight antennas 410, 415 through 420. It will be understood that the system can be designed to accommodate more number of elements. System 400 uses at least a Pumped Distributed Wave Oscillator (PDWO), or Force Mode Distributed Wave Oscillator (FMDWO) or Trigger Mode Distributed Wave Oscillator (TMDWO) referenced earlier, as accurate source of oscillation phases. Reference numeral 450 points to the eight phases for the phased-array transceiver system shown in FIG. 16. These phases directly drive mixers 460, 465, 470, 475, that are used in the receiver or transmitter path corresponding to each antenna. The 8-antenna system shown in FIG. 16 may require 8-phase oscillator. The referenced loop oscillators, namely, PDWO, FMDWO and TMDWO can be tapped symmetrically to provide large number of oscillation phases to be selectively mixed with the incoming signal at the front-end mixer. For this Front-End Phase-Shift (FEPS) system, all of the phases are routed to all of the mixers to provide programmable phase shift in the corresponding path. Phased array systems well-known in the art need to employ phase interpolators to provide the desired oscillation phases. Phase interpolators consume significant amount of power and add noise. According to the present disclosure, however, use of one of TMDWO, FMDWO or PDWO oscillators, the extra power consumption and noise contribution of interpolators are avoided since fine resolution phases are readily available in these oscillator arts.

Figure 17:
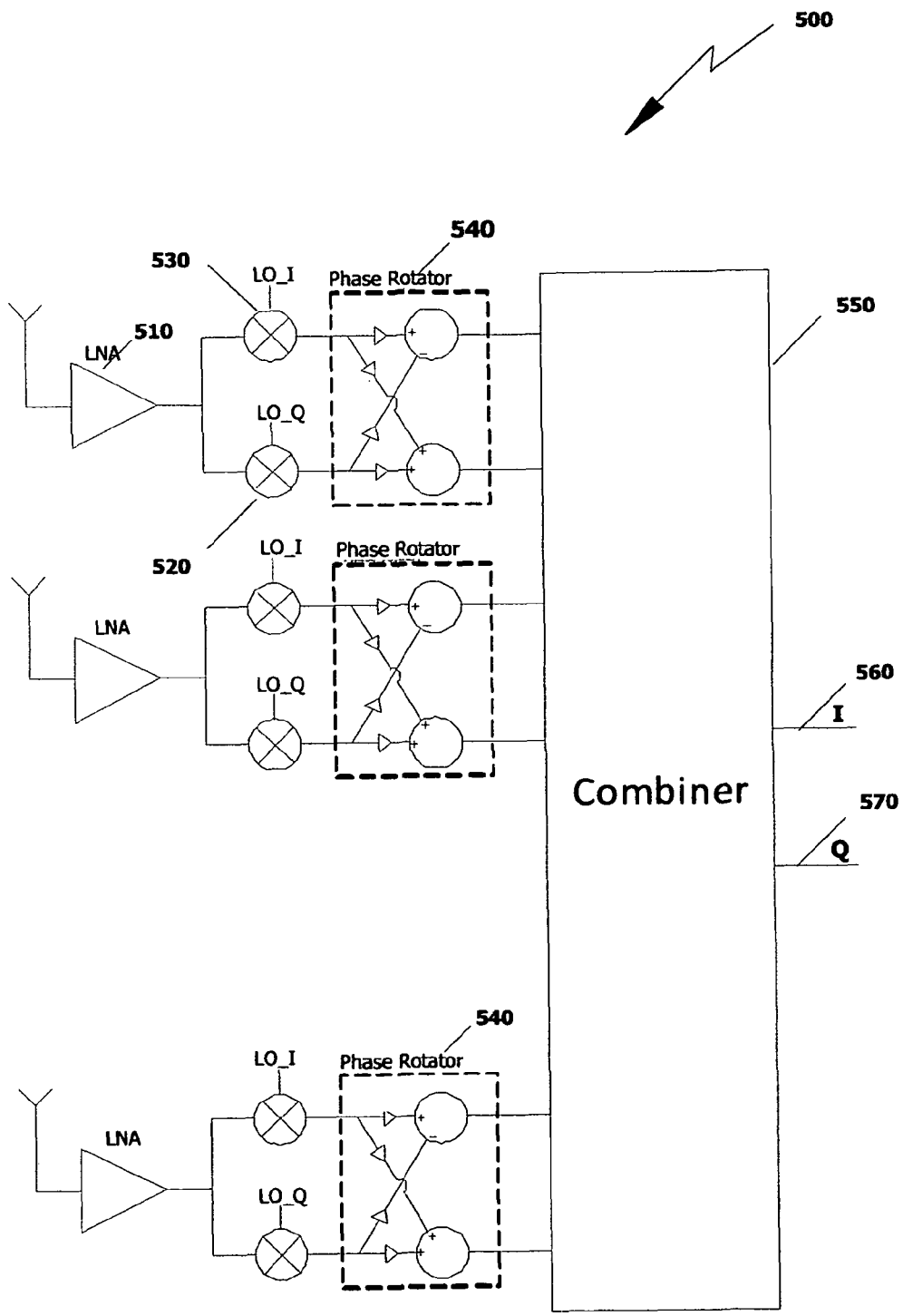
FIG. 17 shows a schematic drawing of the presently disclosed Wave-based Back-End Phased-Array System.

Sending only one set of quadrature oscillation phases only to each mixer path and applying a programmable phase shift at the baseband reduces the loading to PDWO, FMDWO or TMDWO and hence can result in higher oscillation frequencies. This Back-End Phase-Shift system is depicted in FIG. 17 comprising a "combiner" 550 which combines the in-phase and quadrature (IQ) phase-shifted signals to the output ports 560 and 570. In the system quadrature frequency down-conversion happens through quadrature mixers 520 and 530 following low-noise amplifier 510.

These quadrature down-converted signals are cross-coupled inside the phase rotator 540 with proper gain coefficients $A_i$ resulting in an effective gain and phase shift as follows;

$$A_i I \mp \sqrt{1-A_i^2}\, Q + j\left[A_i Q \pm \sqrt{1-A_i^2}\, I\right] = \left[A_i \pm j\sqrt{1-A_i^2}\right](I+jQ)$$

$$\text{Phase shift} = \pm \phi_i$$

where $$\phi_i = \tan^{-1}\left(\frac{\sqrt{1-A_i^2}}{A_i}\right)$$

for $-1<A_i<1$ then $0<\phi_i<180°$. Hence, a programmable phase shift at each path in the range $-180°$ up to $180°$ results in another phased-array scheme that can reduce the effective loading on the wave oscillator.

Figure 18:
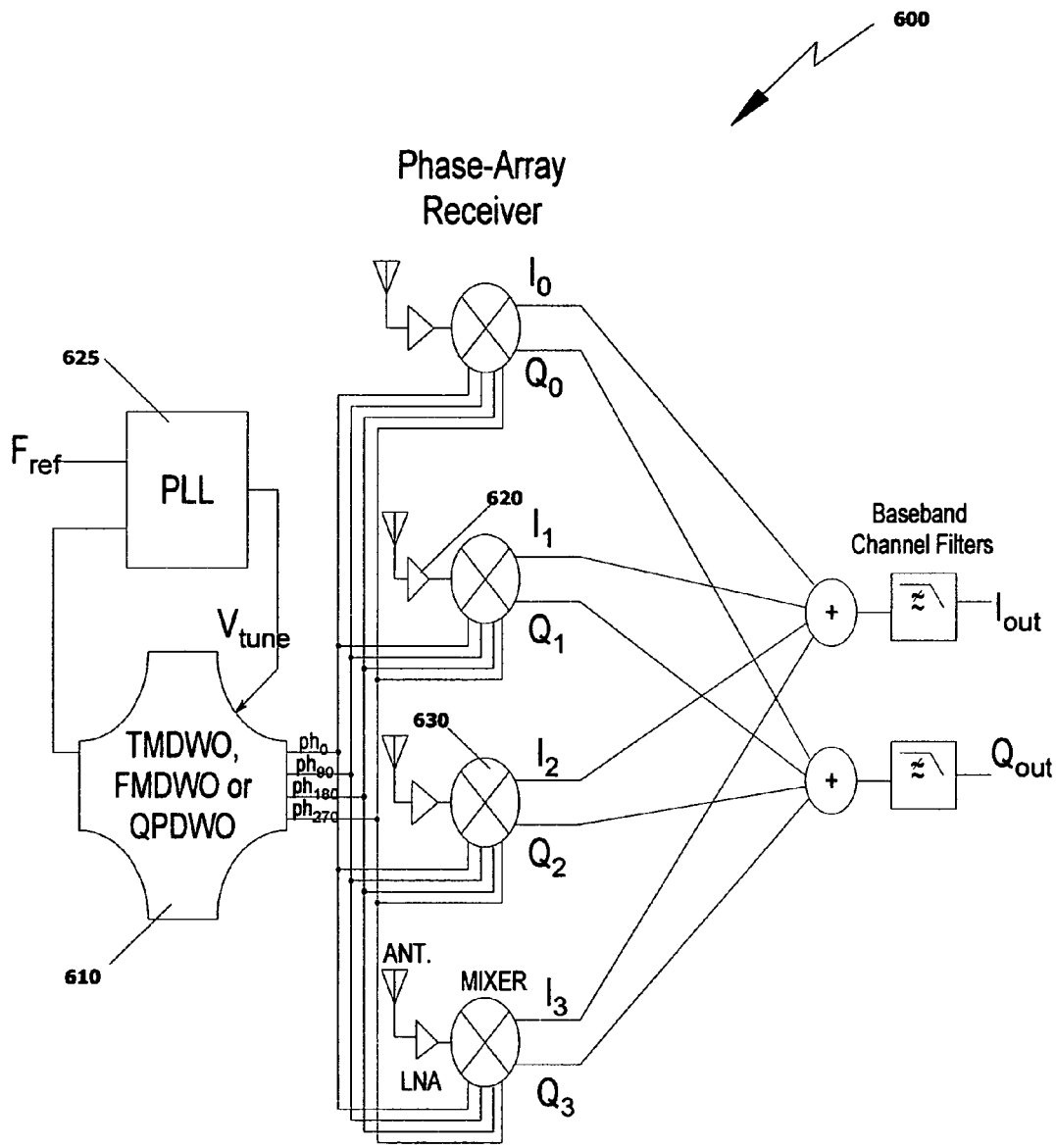
FIG. 18 shows a block-level drawing of the presently disclosed Wave-based 4-element Phased-Array Receiver Block Diagram.

Schematic diagram of a four-element front-end phase shift system is shown in FIG. 18. As described earlier, one of TMDWO, FMDWO or PDWO oscillators 610 that is phase locked to a reference signal through use of a PLL 625 can be tapped symmetrically to provide the required oscillation phases. If desired, arrays with many more elements can be constructed tapping more phases from these oscillator structures. The low-noise amplifiers (LNA) 620 in the received signal paths are followed by mixers with phase multiplexers 630 that down-converts the high frequency content with the desired phase shift through a programmable phase selector. The corresponding quadrature outputs of all signal paths are then combined and filtered if needed. The filters are used to filter out undesired interferer signals out of the desired channel.

Figure 19:
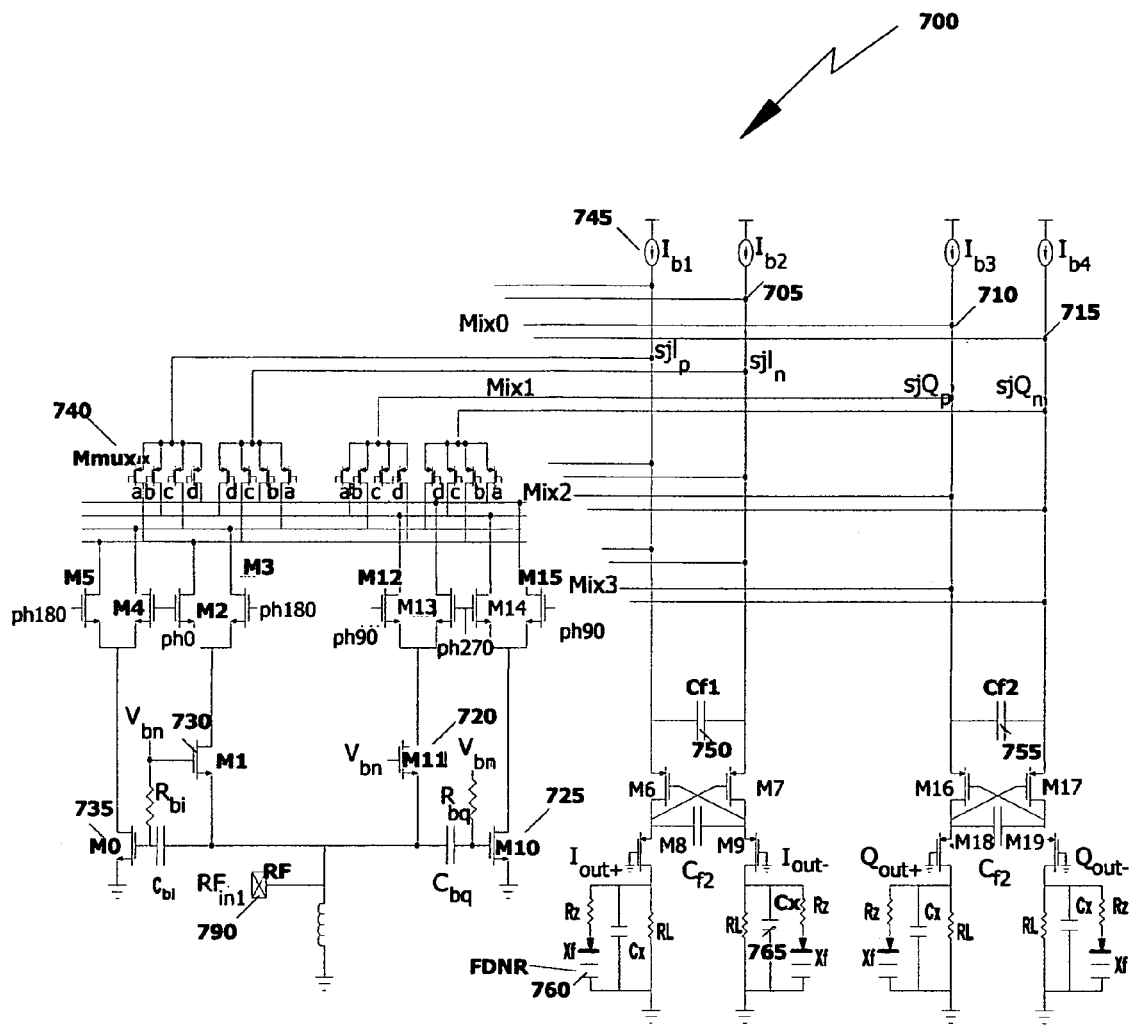
FIG. 19 shows a detailed circuit schematic of the presently disclosed Wave-based 4-element Phased-Array Receiver.

The front-end circuits disclosed herein provide balun that provides single-ended to differential conversion, noise canceling low noise amplifier (LNA), Mixer, combiner and noise-shaped filter functions all in one folded circuit stage as shown in FIG. 19. In one aspect, in addition to signal quality enhancement by phased-array structure, using minimal number of transistors in the signal paths results in a low-noise high-sensitivity receiver architecture. In another aspect, which is referred as Blixelter hereafter, the outputs of all of the front-end quadrature LNA-Mixer pairs (4 in this example) each receiving signal from the corresponding antenna element are combined at the low impedance summing junctions sjIp-sjIn 710, 705, sjQp-sjQn 710, 715. Radio frequency RF input 790 drives the inphase and quadrature (IQ) LNA device pairs M0-M1 730, 735 and M10-M11 720, 725. The cited noise-cancelling common-gate, common-source amplifier pairs 730, 735 and 720, 725 also provide balun functionality, converting the single-ended signal to differential. Quadrature oscillator phases ph0, ph90, ph180, and ph270 mix the RF signal down through mixer devices M2-M5 and M12-M15.

The programmable phase mux devices (Mmux) 740 in each of the signal paths directs the desired IQ phase combination to the combiner summing junctions sjIp-sjIn, sjQp-sjQn. Four current sources $Ib_1$ through $IN_4$ 745 provide DC bias current for the four front-end LNA-mixer pairs and some remaining current to bias the combiner. The combiner implements a second-order noise-shaping pipe-filter through $C_{f1}$ and $C_{f2}$ 750, 755 and additional third-order noise-shaping notch filtering at the load through Frequency-Dependent Negative Resistance (FDNR) 760 and $C_x$ 765. In an aspect, due to the disclosed fifth-order noise shaped filtering, the strong interferers at the adjacent channels are attenuated without significant addition of filter noise. The receiver front-ends implementing such topology can allow higher gain without suffering from adjacent interferers and hence can achieve better sensitivity.

Though various details of the disclosed system are set forth here to provide an understanding of the present invention, it will be obvious, however, to those skilled in the art that some of the specific details may be employed in other similar cases too many to cite here. For example, reducing the circuit noise in a receiver is also an important factor in increasing the receiver sensitivity and hence the radio range. The noise contribution of a receiver can be attributed to two main mechanisms. First is the inherent noise of the receiver circuitry. The noise of a first active receiver block, low noise amplifier (LNA), can be very critical in a radio design. That is, the noise contribution of a circuitry in a chain is attenuated by a value proportional to the gain in the LNA. Hence, noise-cancelling LNA topology is preferred in the proposed Blixelter art.

Another noise mechanism in a receiver system is the noise resulting from the nonlinear mixing of strong interferers in the vicinity of the desired signal channel. Integrated receivers generally perform channel filtering and variable gain amplification at baseband. The presence of strong adjacent channel blockers along with the desired signal requires a filter with high linearity and dynamic range to attenuate these interferers. The filter must be able to process large signals with little intermodulation distortion. Harmonics of the signal will remain in the filter stop-band where they are automatically attenuated. However, it is very possible that $3^{rd}$ order intermodulation between particular combinations of two interfering tones in the stop-band generates significant products in the pass-band. Moreover, since this filter is the first in the chain following the LNA and mixer, its noise contribution remains to be significant in determining the overall noise figure of the radio and hence needs to be minimized.

Figure 20:
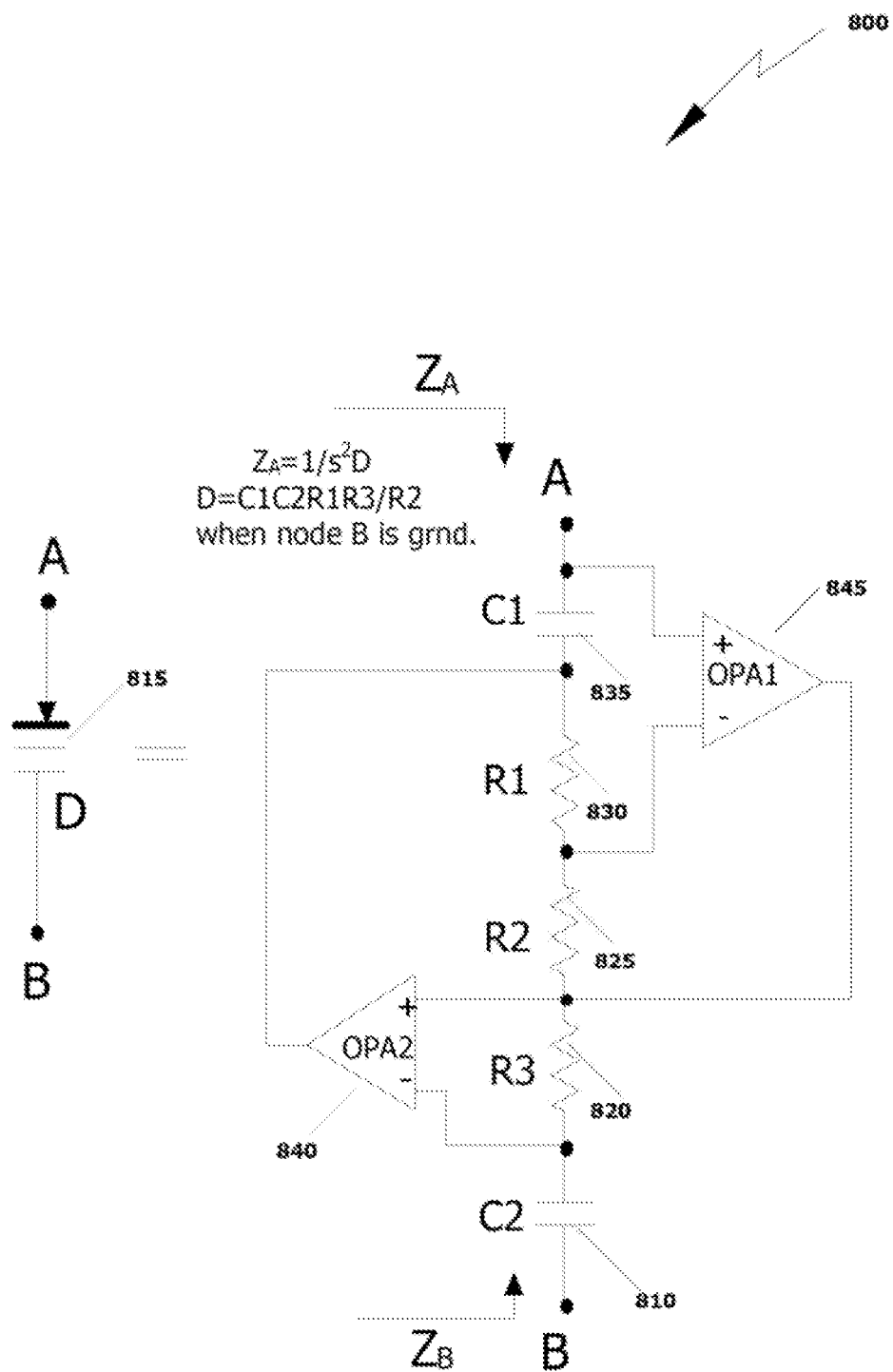
FIG. 20 shows a schematic drawing of a Frequency-Dependent Negative Resistance (FDNR) circuit used in the disclosed phased-array receiver front-end.

A Frequency-Dependent Negative Resistance (FDNR) based noise shaping filtering and noise-shaping current-mode pipe filtering are both incorporated in a combiner branch shown in an FDNR circuit of FIG. 20, enabling the reuse of the current for combining operation. An (FDNR) based noise shaped filter immediately at the mixer output provides a noise shaped high order filtering at this node, hence relaxing the linearity of both the following and the preceding blocks. Accordingly, 4 in FIG. 20 denotes the impedance seen looking into node A while node B is grounded; whereas $Z_B$ is the impedance looking into node B while node A is grounded. R1 (830), R2 (825) and R3 (820) are the resistors, C1 (835) and C2 (810) are capacitors and OPA1 (845) and OPA2 (840) are the operational amplifiers (OPAMPs) that are used to construct an FDNR. Noise of the OPAMPs and of the passive resistors are high-pass shaped reducing the total noise in the desired channel. It will be appreciated that the benefit of incorporating these low in-band noise filtering techniques at early stages of the receiver chain is to attack the blockers in the early stages of the chain so that the inter-modulation noise of the adjacent channels does not limit the sensitivity.

The diagram presented in FIG. 19 of this art uniquely configures various functionalities into a single circuit stage, resulting in mentioned receiver front-end topology; Blixelter. The overall fifth-order filter transfer function for the combiner paths following the mixers which includes active devices M6, M7, M8, M9 and M16, M17, M18, M19 of Blixelter (as in FIG. 19, for example) can be written as follows:

$$\frac{V_{out}(s)}{I_{in}(s)} = \frac{(gm^2/C_{f1}C_{f2})R_f(s^2 DR_z + 1)}{(s^3 DR_z R_L C_x + s^2(DR_z + DR_L) + s(R_L C_x) + 1)}$$
$$(s^2 + s(gm/C_{f1}) + (gm^2/C_{f1}C_{f2}))$$

where $D = C_1 C_2 R_1 R_3/R_2$ of FDNR and gm is the transconductance for the combiner devices M6-M9 and M16-M19. The filter capacitors Cx 765 in FIG. 19 and C2 810 in FIG. 20 which are shown to be single-ended in the schematics with respect to ground can be implemented differentially. It will be evident that equation above represents a fifth-order filtering for the overall Blixelter circuit topology presented.

While the invention has been particularly shown and described with reference to a particular embodiments, it will be appreciated that variations of the above-disclosed embodiments and other features and function, or alternatives thereof, may be desirably combined into many other different systems or applications Also that various presently unforeseen and unanticipated alternatives, modifications, variations or improvements therein may be subsequently made by those skilled in the art which are also intended to be encompassed by the following claims.

What is claimed is:

1. A Quarter-Pumped Distributed Wave Oscillator (QP-DWO) system comprising
    two or more independent electrical conductors forming transmission line loops of a differential medium for traveling wave oscillations;
    a plurality of cross-coupled inverting amplifiers distributed along said transmission line loops, said inverting amplifiers further comprising non-complementary metal oxide or bipolar devices;
    a plurality of quarter wave ($\lambda$/4) shorted transmission line stubs to provide biasing of said cross-coupled inverting amplifiers;
    wherein said quarter wave ($\lambda$/4) shorted transmission line stubs are distributed symmetrically along said independent electrical conductors;
    a plurality of resistors in series with the biasing ($\lambda$/4) stub to eliminate low-frequency lumped mode of oscillation; and
    a plurality of varactors to provide tuning for high frequency, high-bandwidth oscillations in the range of at least from about sub-GHz to about THz.

2. The system according to claim 1, wherein each said independent electrical conductor in said transmission line loops is structured to use the other as a differential sustainer.

3. The system according to claim 1, wherein said cross-coupled inverting amplifiers use the signal in one of said independent electrical conductors as booster for the opposing phase traveling in the other said conductor.

4. The system according to claim 1, wherein said non-complementary metal oxide or bipolar cross-coupled inverting amplifiers are distributed symmetrically along said independent electrical conductors.

5. The system according to claim 1, wherein said non-complementary cross-coupled inverting amplifiers comprise NMOS (NPN) or PMOS (PNP) devices.

6. An Inductively-Pumped Distributed Wave Oscillator (IPDWO) system comprising
    two or more independent electrical conductors forming transmission line loops of a differential medium for traveling wave oscillations;
    a plurality of cross-coupled inverting amplifiers distributed along said transmission line loops, said Inverting amplifiers further comprising non-complementary metal oxide or bipolar devices;
    a plurality of inductors to provide biasing of said cross-coupled inverting amplifiers;
    a plurality of resistors in series with the biasing inductors to eliminate low-frequency lumped mode of oscillation;
    a plurality of parallel capacitors forming Resonant-Pumped Distributed Wave Oscillator (RPDWO) to create resonance at a core traveling wave frequency at bias injections points;
    a plurality of varactors to provide tuning for high frequency, high-bandwidth oscillations at least in the range from about sub-GHz to about THz; and
    a lumped traveling wave oscillator system where discrete inductors rather than transmission lines are used for the wave oscillation loop path elements.

7. The system according to claim 6, wherein each said independent electrical conductor in said transmission line loops is structured to use the other as a differential sustainer.

8. The system according to claim 6, wherein said cross-coupled inverting amplifiers use the signal in one of said independent electrical conductors as booster for the opposing phase traveling in other one of said independent electrical conductors.

9. The system according to claim 6, wherein said plurality of inductors is distributed symmetrically along said independent electrical conductors.

10. The system according to claim 6, wherein said non-complementary metal oxide or bipolar cross-coupled inverting amplifiers are distributed symmetrically along said independent electrical conductors.

11. The system according to claim 6, wherein said non-complementary metal oxide cross-coupled inverting amplifiers comprise NMOS (NPN) or PMOS (PNP) devices.

12. A high frequency phased-array transceiver system comprising
    a multi-phase low-noise signal source comprising Trigger-mode Distribute Wave Oscillator (TMDWO), Forced-Mode Distributed Wave Oscillator (FMDWO) or Pumped Distributed Wave Oscillator (PDWO);
    a front-end phase-shift system coupled with said multi-phase signal source;
    a back-end phase-shift system coupled with quadrature phases of said multi-phase signal source;
    a radio front-end topology configured to utilize said multi-phase signal source;
    a low-noise multi-element phased-array receiver system coupled with said radio front-end; and
    said multi-element phased-array receiver system further comprising low-noise 4-element phased-array utilizing Blixelter front-end topology with TMDWO, FMDWO, or PDWO wave oscillators as multi-phase signal source providers.

13. The system according to claim 12, wherein multi-phase operation of said TMDWO comprises a trigger mechanism provided by an auxiliary oscillator.

14. The system according to claim 12, wherein multi-phase operation of said FMDWO comprises a force mechanism.

15. The system according to claim 12, wherein multi-phase operation of said QPDWO comprises quarter wave ($\lambda/4$) shorted transmission line stubs.

16. The system according to claim 12, wherein said a front-end phase-shift system utilizes phased-array system phases of TMDWO, FMDWO, or PDWO oscillators at front-end mixers.

17. The system according to claim 12, wherein said back-end phase-shift system utilizes only the quadrature phases of TMDWO, FMDWO, or PDWO oscillators at front-end mixers and adjusts the desired amount of phase shift afterwards through cross-coupling the quadrature signal paths with the corresponding amount of coupling coefficient.

18. The system according to claim 12, wherein said radio front-end topology comprises Blixelter, including balun, LNA, mixer, and noise shaping fifth-order notch filtering in a single folded circuit stage.

* * * * *